(12) United States Patent
Koh et al.

(10) Patent No.: US 6,610,616 B2
(45) Date of Patent: Aug. 26, 2003

(54) METHOD FOR FORMING MICRO-PATTERN OF SEMICONDUCTOR DEVICE

(75) Inventors: Cha-won Koh, Seoul (KR); Sung-eun Hong, Gyunggi-Do (KR); Min-ho Jung, Gyunggi-Do (KR); Jin-soo Kim, Daejeon-shi (KR); Geun-su Lee, Gyunggi-Do (KR); Jae-chang Jung, Gyunggi-Do (KR)

(73) Assignee: Hynix Semiconductor Inc, Gyunggi-do (KR)

( * ) Notice: Subject to any disclaimer, the term of this patent is extended or adjusted under 35 U.S.C. 154(b) by 0 days.

(21) Appl. No.: 09/888,661

(22) Filed: Jun. 25, 2001

(65) Prior Publication Data

US 2002/0090832 A1 Jul. 11, 2002

(30) Foreign Application Priority Data

Jun. 30, 2000 (KR) ........................................ 2000-37246

(51) Int. Cl.⁷ ...................... H01L 21/31; H01L 21/469; G03C 5/00; G03C 1/492
(52) U.S. Cl. ...................... 438/781; 438/780; 427/554; 430/311; 430/514
(58) Field of Search ................................. 438/780, 781; 427/554; 430/296, 311, 512, 514, 942

(56) References Cited

U.S. PATENT DOCUMENTS

| 5,137,751 A | 8/1992 | Burgess et al. |
| 5,437,961 A | 8/1995 | Yano et al. |
| 6,117,618 A * | 9/2000 | Yedur et al. ................ 430/296 |

OTHER PUBLICATIONS

Wolf et al, Silicon Processing for the VLSI Era, vol. 1, pp. 434–436.*

* cited by examiner

Primary Examiner—Alexander Ghyka
(74) Attorney, Agent, or Firm—Marshall, Gerstein & Borun

(57) ABSTRACT

A method for forming a micro-pattern of a semiconductor substrate, and more particularly, to a method for preventing defects in a photoresist pattern, such as undercut or footing, due to inter-mixing between an organic anti-reflective coating and a photoresist by forming a carbonized layer on the surface of the organic anti-reflective coating by a curing process like ion implantation or E-beam curing.

7 Claims, 3 Drawing Sheets

METHOD FOR FORMING MICRO-PATTERN OF SEMICONDUCTOR DEVICE

BACKGROUND

1. Technical Field

The present invention relates to a method for forming a micro-pattern of a semiconductor device, and more particularly, to a process for preventing defects in a photoresist pattern, such as footing or undercut occurred in using organic anti-refective coatings.

2. Description of the Related Art

With an increase in integration density of a semiconductor device, lithographic techniques are becoming the key to the realization of highly integrated memory devices. Particularly, a process for forming a photoresist pattern is a very important process in fabricating a semiconductor apparatus.

Generally, a photoresist pattern depends on an exposure process. In the exposure process, the photoresist pattern is greatly affected by light reflected by a bottom semiconductor substrate. In order to solve this problem, an anti-reflective layer is additionally formed prior to the process for forming a photoresist pattern.

As a widely-known anti-reflective layer, an inorganic SiON layer is a bottom anti-reflective layer(BARL) commonly used in the lithographic process using a KrF line.

However, in an etching process, a problem occurs in the etching selectivity of an inorganic SiON layer to a semiconductor substrate. If an unnecessary inorganic SiON layer remains on the semiconductor substrate after the etching process, it affects the performance of the device, thereby requiring the inconvenience of removing it completely.

In addition, in the case that a transparent silicon oxide layer with a complex stepped portion is formed on the bottom semiconductor substrate, the thickness of the formed inorganic SiON layer is not uniform in all parts thereof, and thus the intensity of a reflected light on the bottom semiconductor substrate is non-uniform.

In addition, since the inorganic SiON layer is sensitive to oxygen in air and forms a non-uniform, thin oxide layer after a lapse of time, it generates defects in a chemically amplified resist (CAR) to be formed on an upper portion of the inorganic SiON layer, thereby causing the inconvenience of removing the oxide layer by an oxygen plasma process.

On the other hand, in late-nineties, as the chemically amplified resist obtained a high transmittance to overcome resolution limitations, a problem occurs in that a photoresist pattern is deteriorated on a highly reflective substrate. In such a circumstance, limitations in using only the inorganic SiON layer as an anti-reflective layer result.

Hence, anti-reflective coating materials capable of functioning as an inorganic SiON layer or replacing it have been developed. As a result, organic anti-reflective coating materials that had been developed in mid-nineties, but have rarely been used because of little need for it, are being used again recently.

These organic anti-reflective coatings dramatically have increased etching speed by using metacrylate resins, rather than prior art resins containing benzene radical. Techniques have been developed for using methacrylate resins as anti-reflective coatings even at a thickness of less than 1000 Å. In addition, by cross-linking the insides of the organic anti-reflective coatings having a small thickness with each other so that the surfaces of the organic anti-reflective coatings are hardened by using a thermal acid generator (TAG) compound, it is possible to develop techniques for adjusting compatibility at the interface with photoresists formed on the upper portion of the organic anti-reflective coating.

However, in the case of using the above-described organic anti-reflective coatings, a problem occurs about matching with respect to some parts of the photoresists. In other words, inter-mixing between the organic anti-reflective coating and the photoresist often occurs according to its manufacturer, thereby generating defects in a photoresist pattern, such as (a) footing or (b) undercut as shown in (a) of FIG. 1 and (b) of FIG. 2.

SUMMARY OF THE DISCLOSURE

A method is disclosed for preventing defects in a photoresist pattern, such as undercut or footing, due to inter-mixing between an organic anti-reflective coating and a photoresist by forming a carbonized layer on the top surface of the organic anti-reflective coating by a curing process like ion implantation or E-beam curing.

A method for forming a micro-pattern of a semiconductor device is disclosed which comprises: forming an organic anti-reflective coating on the top of a semiconductor substrate and carrying out a hard-baking process; carrying out a curing process on the organic anti-reflective coating to form a carbonized layer thereon; coating a photoresist on the top of the carbonized layer and carrying out a soft-baking process; carrying out exposing and developing processes on the substrate coated with the photoresist to form a photoresist pattern; and washing the resultant material.

BRIEF DESCRIPTION OF THE DRAWINGS

The objects, features and advantages of the present invention will become more apparent from the following detailed description when taken in conjunction with the accompanying drawings, in which.

DETAILED DESCRIPTION OF THE PRESENTLY PREFERRED EMBODIMENTS

The disclosed methods will now be described with reference to the accompanying drawings. It will be appreciated by those skilled in the art that this embodiment has been provided solely for the purpose of illustration, and are in no way to be regarded as limiting to the scope of the disclosure.

FIGS. 3 through 6 are cross-sectional views illustrating a method for forming a micro-pattern of a semiconductor device according to the disclosed method.

Figure 7:
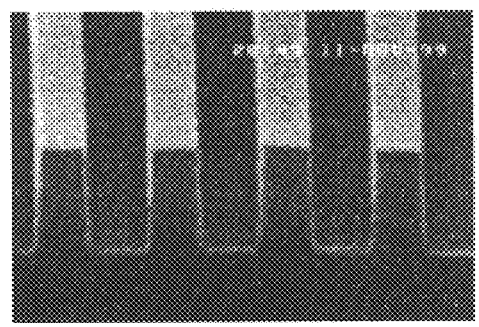
FIG. 7 illustrates a non-defective photoresist pattern formed in accordance with the disclosed method for forming a micro-pattern of a semiconductor device.

FIG. 7 is a view illustrating a non-defective photoresist pattern formed in accordance with the disclosed method for forming a micro-pattern of a semiconductor device.

Figure 1:
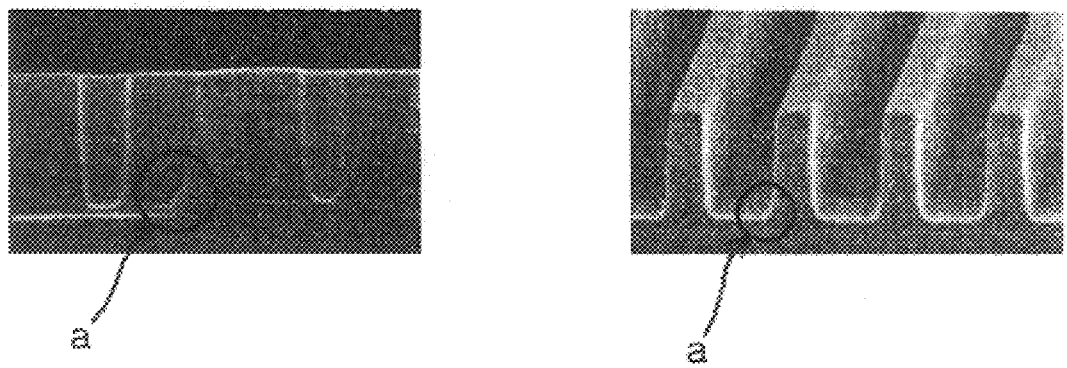
FIG. 1 illustrates a footing phenomenon occurred by inter-mixing between an anti-reflective coating and a photoresist in forming a micro-pattern according to the conventional art.
Figure 2:
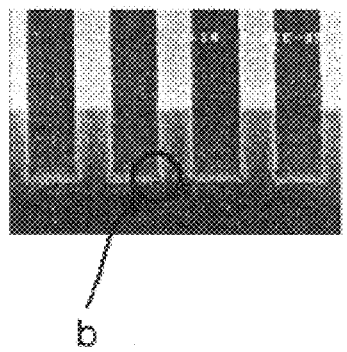
FIG. 2 illustrates an undercutting phenomenon occurred by inter-mixing between the anti-reflective coating and the photoresist in forming a micro-pattern according to the conventional art.
Figure 3:
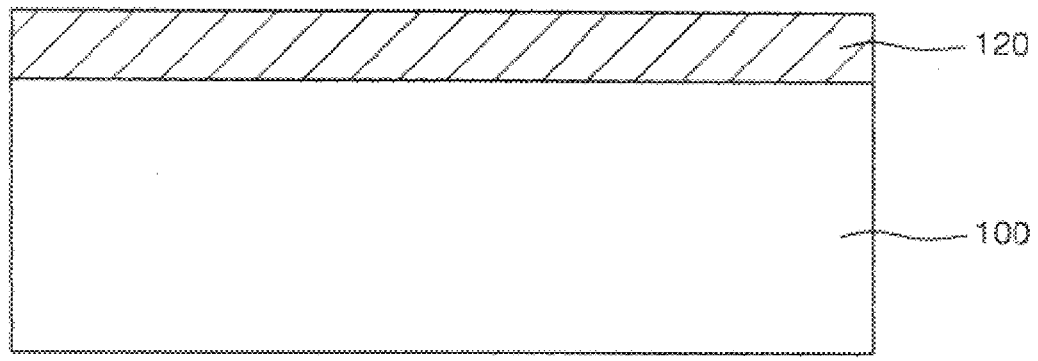
FIGS. 3 through 6 are cross-sectional views illustrating a disclosed method for forming a micro-pattern of a semiconductor device.

First of all, as illustrated in FIG. 3, an organic anti-reflective coating 120 is thinly formed at a thickness ranging from about 10 to about 100 nm on the top of a semiconductor substrate 100 on which a lithographic process is to be conducted. At this time, the surface of the semiconductor substrate 100 is processed by HMDS (Hexamethyl Disilazane) in advance to thereby increase its adhesion to the organic anti-reflective coating 120.

Next, a hard-baking process is performed onto the organic anti-reflective coating 120 to evaporate any solvents in the organic anti-reflective coating. At this time, the hard-baking process is conducted for a time period ranging from about 10 to about 300 seconds under a temperature ranging from about 150 to about 250° C.

Figure 4:
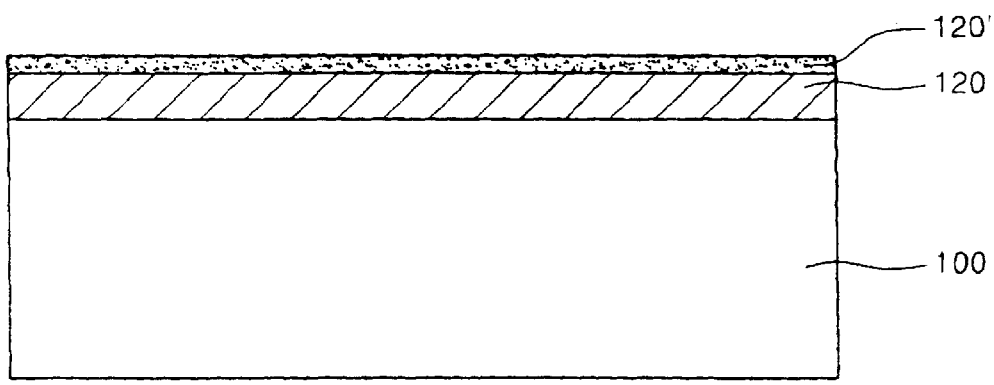

Then, as illustrated in FIG. 4, a curing process is conducted on the surface of the organic anti-reflective coating 120 to form a carbonized layer 120'.

At this time, the curing process is one of ion implantation and E-beam curing.

The ion implantation is performed at an accelerated voltage ranging from about 20 to about 60 keV by using any one of argon, hydrogen, neon, and arsenic. In the E-beam curing, a dose is utilized ranging from about 500 to about 4000 uC/cm$^2$.

The formed carbonized layer 120' serves to prevent inter-mixing between the organic anti-reflective coating 120 and a photoresist 140. By using this, the occurrence of (a) undercut or (b) footing phenomenons can be prevented in a process for forming a photoresist pattern.

Figure 5:
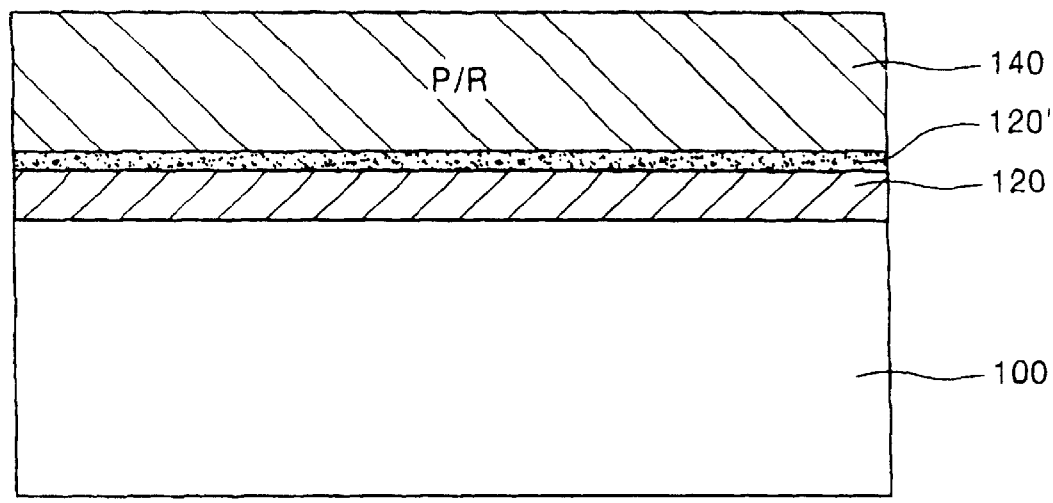

Next, as illustrated in FIG. 5, afterwards, a soft-baking process is conducted on the photoresist 140 for a time period ranging from about 60 to about 50 seconds under a temperature ranging from about 90 to about 130° C. to thus evaporate solvents in the photoresist 140.

Figure 6:
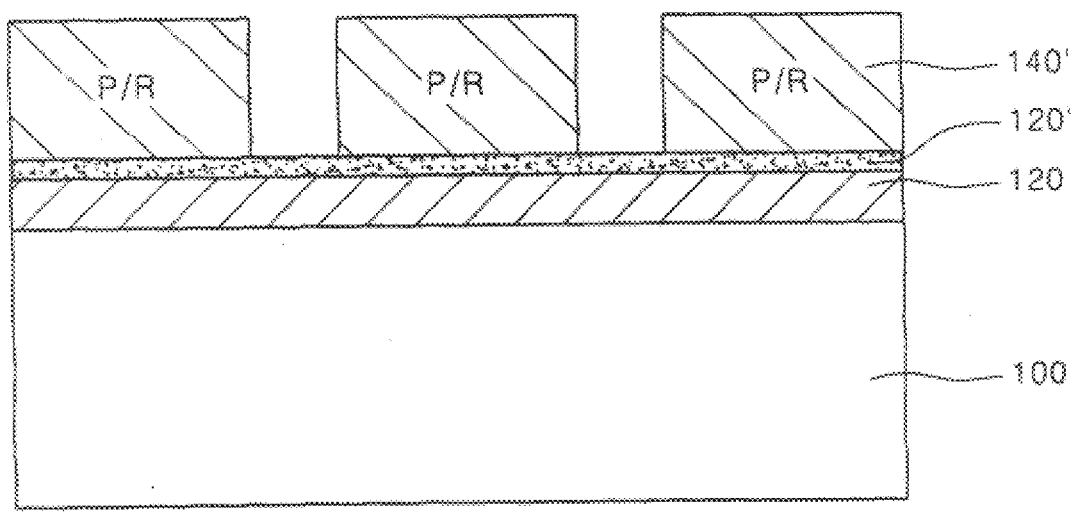

Next, as illustrated in FIG. 6, the top of the photoresist 140 is covered with a mask (not shown) having a desired pattern. Then, an exposure process is carried out at the semiconductor substrate 100 coated with the photoresist by using either one of g-line, KrF, and ArF exposure tools suitable for the photoresist 140, and thereafter a post-exposure bake process is carried out thereat. Then, a development process is carried out at the resultant material by TMAH (Tetra methyl Ammonium Hydroxide in a concentration ranging from about 0.1 to about 10%) to form a photoresist pattern 140'.

Finally, the resultant material is cleaned by deionized water.

By the above processes, it is possible to prevent the occurrence of inter-mixing between the organic anti-reflective coating and the photoresist owing to the carbonized layer between the organic anti-reflective coating 120 and the photoresist 140 in forming a photoresist pattern, thereby obtaining a non-defective photoresist pattern as shown in FIG. 7.

As described above, the disclosed method prevents defects in a photoresist pattern of a semiconductor substrate, such as undercut or footing problems occurred in using an organic anti-reflective coating, by preventing inter-mixing between an organic anti-reflective coating and a photoresist by forming a carbonized layer on the surface of the organic anti-reflective coating by a curing process.

In addition, the disclosed method can increase the yield rate of a semiconductor device by using the method of the invention in forming a micro-pattern of a highly integrated semiconductor device from 28M through to 256M, 1G, and 4G.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method for forming a micro-pattern of a semiconductor device comprising:

forming an organic anti-reflective coating on the top of a semiconductor substrate and carrying out a hard-baking process;

carrying out a curing process on the organic anti-reflective coating to form a carbonized layer thereon wherein the curing process is ion implanting that is performed at an accelerated voltage ranging from about 20 to about 60 keV by using any one of argon, hydrogen, neon, and arsenic;

coating a photoresist layer on the carbonized layer and carrying out a soft-baking process;

carrying out exposing and developing processes on the photoresist layer to form a photoresist pattern thereon to form a resultant material; and cleaning the resultant material.

2. The method of claim 1, wherein the organic anti-reflective coating has a thickness ranging from about 10 to about 100 nm.

3. The method of claim 1, wherein the hard-baking process is carried out for a time period ranging from about 10 to about 300 seconds under a temperature ranging from about 150 to about 250° C.

4. The method of claim 1, wherein the photoresist is either one of g-line, KrF, and ArF photoresists, and is formed with a thickness ranging from about 100 to about 1000 nm.

5. The method of claim 1, wherein the soft-baking process is carried out for a time period ranging from about 60 to about 50 seconds under a temperature ranging from about 90 to about 130° C.

6. The method of claim 1, wherein the exposing process is carried out by using either one of g-line, KrF, and ArF exposure tools suitable for the photoresist.

7. The method of claim 1, wherein the developing process is carried out by using TMAH at a concentration ranging from about 0.1 to about 10%.

* * * * *